United States Patent [19]

Finaurini

[11] Patent Number: 4,698,720
[45] Date of Patent: Oct. 6, 1987

[54] DYNAMIC PROTECTION INTEGRATED DEVICE, IN PARTICULAR FOR MOS INPUT STAGES INTEGRATED CIRCUITS

[75] Inventor: Roberto Finaurini, Ancona, Italy

[73] Assignee: SGS Microelettronica S.p.A., Catania, Italy

[21] Appl. No.: 862,321

[22] Filed: May 12, 1986

[30] Foreign Application Priority Data

May 13, 1985 [IT] Italy ................................ 20670 A/85

[51] Int. Cl.$^4$ ............................................. H02H 3/24
[52] U.S. Cl. ........................................ 361/91; 361/90; 361/18; 361/88
[58] Field of Search ....................... 361/18, 56, 58, 91, 361/92, 86, 88, 90, 212; 323/266, 271, 299, 303; 307/44, 48, 64, 66; 320/14; 357/23.13

[56] References Cited

U.S. PATENT DOCUMENTS 4,400,625 7/1983 Hussey ................................ 307/66
4,492,876 1/1985 Colbert et al. ..................... 307/66

Primary Examiner—A. D. Pellinen
Assistant Examiner—Todd E. DeBoer
Attorney, Agent, or Firm—Guido Modiano; Albert Josif

[57] ABSTRACT

This dynamic protection device is particularly intended for integrated circuits having input MOS stages and logic or analog inputs fed by voltages and/or currents whose value can increase above those bearable with traditional protection systems. The device is composed of a first section for protection against voltages above a first set threshold value and a second protection section against voltages below a set threshold value. The device is made in MOS technology and is disposed between the input of the circuit to be protected and the power supply. The two sections operate as turned off switches with input voltage within the allowed voltage range and selectively turned on outside of that range, such that on the input voltage exceeding the upper threshold the first section switches on absorbing current at the input and conveying it toward the power supply, while on the voltage dropping below the lower threshold the second section becomes active absorbing from the power supply the current and conveying it to the input. The threshold values can be set when designing the device selecting suitable manufacture technologies and implantation levels.

5 Claims, 4 Drawing Figures

DYNAMIC PROTECTION INTEGRATED DEVICE, IN PARTICULAR FOR MOS INPUT STAGES INTEGRATED CIRCUITS

BACKGROUND OF THE INVENTION

This invention relates to a dynamic protection integrated device, in particular for integrated circuits with input stage in MOS technology.

As is known, the input stages of some integrated circuits made in the MOS technology formed of fairly delicate structures require to be protected against electrostatic discharges. To that end, protections are utilized which are typically formed by a diode which intervenes when the input voltage reaches its breakdown voltage, e.g. 15 V. That diode is constructionally fairly strong and capable of protecting the gate and possibly also the diffused zones of the MOS transistors forming the input stage of the integrated circuit to be protected. In general, moreover, on the input there is applied a resistor for protection of the diode itself. In fact, a high tension discharge with very high breakaway current having a certain decay time can already cause the circuit to become damaged.

In FIG. 1 there is shown an implementation where an integrated circuit 3, to the input terminals 2 whereof a voltage is applied, for example mains voltage, is protected by an outer resistor 1 disposed between one of the terminals 2 and the input of the integrated circuit 3. FIG. 1a presents the input of an integrated circuit with MOS input stage having a protection formed by a diode 4 and the resistor 1. Here the input stage is represented schematically by the MOS transistor 5 to the gate of which the input signal is applied through the protection resistor 1, which gate is protected through the diode 4.

This known protection system is adequate when the device is utilized for the typical purpose for which it is designed with an expected input voltage range, but not in the instance where the device must be utilized for a wider voltage range than the designed one. In fact, such devices are utilized for instance with very high voltages, e.g. to detect zero passing, or to control the presence of the mains voltage, or to monitor other electric signals applied to the input, so as to control devices placed downstream. In that case on the input there may be applied a much higher voltage than the typical logic level one (in some cases up to tens or hundreds Volts) with a reduction resistor. In that case there may occur, however, anomalous phenomena which partly hinder or at least disturb the device operation.

For example, high positive potentials cause the oxide of the MOS gate to become damaged with consequent destruction of the input stage, or may cause breakdown of the protection diode, whereas negative voltages bring about a forward bias current through the diode. For example, in the instance of application of an alternating voltage during the positive halfwave, the input voltage may go up to the value of intervention of the protection. There occurs then a sharp descent of the voltage to the lower intervention value and again climbing back with a series of oscillations about the lower cut off value. That value is close to the high logic value and involves therefore noise in the instance of logic operation of the MOS integrated circuit. In the instance of the negative halfwave, there occurs an even worse behavior. In fact, as soon as the diode begins to conduct forward it injects electrons into the substrate, discharging the floating nodes (where preloaded data are present, for example) within a certain distance from the input terminal. Consequently, the device works no more and the results obtained are unreliable. That effect becomes more significant at less high frequencies and as the number of the MOS structures in the IC, connected to the input stage, increases.

SUMMARY OF THE INVENTION

Therefore, the task of this invention is to provide a dynamic type protection for combination with the known diode electrostatic protection and which can operate reliably to avoid the undesired phenomena already illustrated.

It is a particular object of this invention to provide a dynamic protection integrated circuit operating on both logic inputs and analog inputs which in the allowed voltage range operates as an open circuit, neither absorbing nor supplying current, thereby being completely "transparent" for the protected associated device.

Another object of this invnetion is to provide a reliable dynamic protection integrated device the intervention values of which can be easily and controllably varied at the designing stage.

A not least object of this invention is to provide a said dynamic protection integrated device which has reduced area requirements and can be fabricated with already available technologies.

The above objects and others to become apparent hereinafter are achieved by a dynamic protection integrated device, in particular for integrated circuits with MOS technology input stage, characterized in that it comprises a first section of protection against voltages above a first settable threshold value and a second section of protection against voltages below a second settable threshold value, and in that said first and second sections are made in MOS technology, disposed between the input stage of the circuit to be protected and the power line and operate substantially as diodes in the turned off condition for input voltages within the range defined by said threshold voltages and adapted to turn on selectively on said input voltage exceeding said first threshold or falling below said second threshold, said first section being adapted to convey toward the power line the current picked up at the input in case the input voltage exceeds said first threshold, and said second section being adapted to force toward the input the current picked up on the power line in case the input voltage drops below said second threshold.

BRIEF DESCRIPTION OF THE DRAWING

Further features and advantages will be apparent from the description of a preferred but not exclusive embodiment, shown by way of illustration and not of limitation in the accompanying drawing, where.

Figure 1:
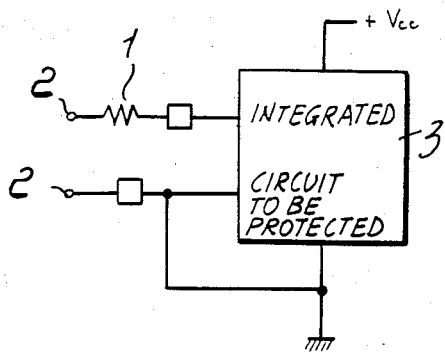
FIGS. 1 and 1a are simplified circuit diagrams of the known protections.
Figure 1A:
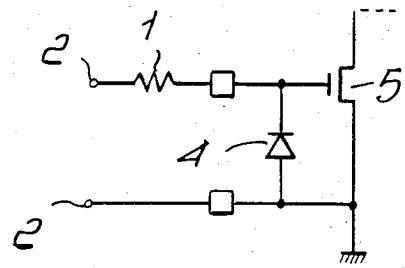

Hereinafter, only FIGS. 2 and 3 will be described because FIGS. 1 and 1a have already been described in the preamble to this description.

DESCRIPTION OF A PREFERRED EMBODIMENT

Figure 2:
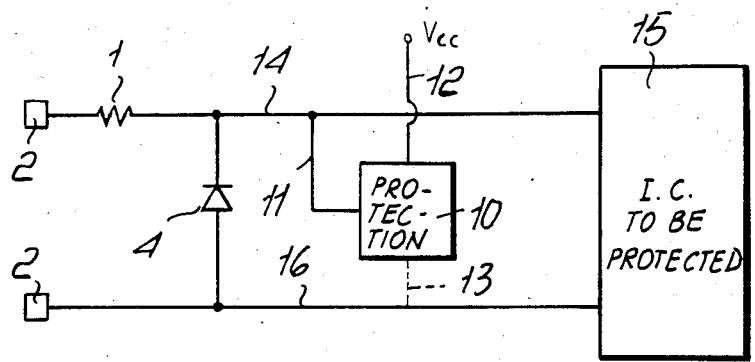
FIG. 2 is a schematical diagram of the connection of the integrated device according to the invention to a circuit to be protected.

Thus, with reference to FIG. 2, there is presented the connection of the device according to the invention with respect to an integrated circuit to be protected, represented here diagrammatically by a block identified with the reference numeral 15. In detail the integrated device according to the invention, indicated at 10, is disposed in parallel with the protection of known type for electrostatic discharges, consisting of a resistor 1 and a diode 4 connected to the input terminals 2. More particularly the device 10 has an input line 11 connected to the integrated circuit input line 14, and a power line 12 connected to the supply voltage $V_{cc}$. The device 10, moreover, has a further line 13 connected to the line 16 leading to the circuit to be protected 15. That line has only been shown in ghost lines because it only represents a reference and does not absorb the current that flows through the input.

Figure 3:
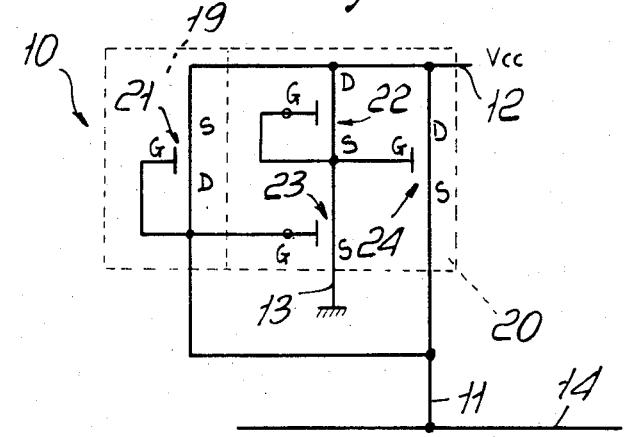
FIG. 3 shows a simplified circuit diagram of the integrated device according to the invention.

Let us now refer to FIG. 3, showing the circuit diagram of the device. As may be seen, the protection device 10 is composed substantially of two sections indicated respectively with the reference numerals 19 and 20. Those sections operate as switching means and intervene at different voltages at different operating conditions. In particular, the section 19 intervenes on the input voltage exceeding the power supply voltage $V_{cc}$ plus a settable voltage, absorbing a current from the line 14 through the line 11, whilst the section 20 intervenes on the input voltage dropping below a particular threshold value forcing a current from the power supply line 12 toward the line 14 through the line 11. Thus, both the section 19 and the section 20 are useful; the former to absorb current from the input line of the device to be protected and the latter to absorb from the power line discharging it then either toward the power line or the input line, so as to prevent the input voltage of the circuit to be protected from growing or falling out of the set limits, with the negative consequences explained hereinabove. In practice, from the above and from FIG. 3 it is clear that the protection sections 19 and 20 have each an input terminal (connected to line 11 for section 19 and line 12 for section 20) and an output terminal (connected to line 12 for section 19 and to line 11 for section 19), with the input terminal of section 19 connected with output terminal of section 20, and vice versa. Thereby the protection sections define unidirectional lines selectively flown by current in mutually opposite directions at the intervention of either protection section.

In detail the section 19 is composed of a MOS transistor 21 of the enhancement type which is diode connected. The transistor 21 has the terminals of the control gate and drain connected in common and with the input of the device represented by the line 11 and the source terminal connected to the power supply $V_{cc}$ through line 12.

The section 20 comprises instead a pair of MOS transistors 22 and 23 of the depletion type and forming an inverter. To the output of that inverter there is then connected a MOS transistor 24 of the enhancement type the source terminal whereof is connected to the inverter input, thus forming a source follower structure. In detail the transistor 22 has the drain connected to the power supply line $V_{cc}$, and the gate and source terminal connected in common to the drain of the transistor 23 and the gate of the transistor 24. Furthermore, the gate of the transistor 23 is connected to the input line 11, whilst ist source is connnected to ground through the line 13. Lastly, the enhancement transistor 24 is connected with the drain to the power line $V_{cc}$ and with the source to the input stage of the circuit to be protected through the line 11.

The operation of the device according to the invention is as follows.

When the input voltage between lines 14 and 16 is within the voltage range defined by the threshold or cut-in voltages of the sections 19 and 20, the device is not seen by the circuit to be protected. In fact, since the voltage $V_{GS}$ of the transistor 21 is negative or below the on value, the transistor 21 is off and absorbs no current. The same applies to section 20, because the transistor 24 has a voltage $V_{GS}$ negative or below the on value and is therefore off whilst the gate of the transistor 23 absorbs no current. When instead the input voltage rises above the upper threshold value, defined by the supply voltage $V_{cc}$ plus the on voltage of the transistor 21, the transistor 21 has a positive voltage $V_{GS}$ and turns therefore on allowing a flow of current from the line 11 toward the power supply $V_{cc}$ line 12. During this stage, transistor 24 remains in the OFF state.

On the contrary, when the voltage on the input between lines 14 and 16 drops below the lower threshold value causing switching over of the inverter circuit formed by the transistors 22 and 23, there occurs increase of the gate voltage of the transistor 24. Consequently, that transistor 24 turns on forcing a current from the supply voltage $V_{cc}$ toward the line 14 through the input line 11. In other words, when the input voltage drops below the lower threshold value, the input variation is multiplied (inverted) in the inverter 22,23 thereby the gate voltage of the tranasistor 24 begins to increase, causing increase of the current through that transistor as the square of the variation of its $V_{GS}$ so as to oppose the voltage decrease on the input.

It should be further noted that the cut-in voltages of the device may be suitably varied during design of the device, for example, the threshold voltage of the transistor 21 as well as the lower threshold voltage, defined by the switch-over voltage of the inverter 22,23, depend on the technology utilized to make the transistor itself, in particular they may be adjusted by suitably selecting the implantation dose of the transistors 21, 22 and 23, so as to permit accommodation according to the desired application.

As may be seen from the preceding description, the invention fully achieves the objects set forth. In fact, an integrated device has been made which can be designed so as, within the normal operating voltage range of the circuit to be protected, not to be seen, because it absorbs current neither from the input stage of the circuit to be protected nor from the outside (terminals 2), whereas as the input voltage exceeds the set upper threshold value, there occurs turning on of the section 19 which begins to pull current through the line 11 and discharge it toward the power supply line 12, preventing therefore intervention of the known protection against electrostatic discharges during normal operating conditions (with fed integrated circuit). On the contrary, on the input voltage reducing itself below the lower threshold value, the section 20 turns on and pulls current from the power supply toward the input line 11 and line 14, preventing further reduction of the input voltage and intervention of the diode 4 with the injection of damaging electrons, as for a conventional protection without the device according to the invention.

Furthermore, the device is reliable, its intervention thresholds can be adjusted and manufacturing expenditure and area consumption are low. Lastly, the device according to the invention has rather fast times of intervention, abundantly adequate to prevent the malfunctions described.

The invention herein is susceptible to many modifications and changes, within the scope of the inventive concept.

I claim:

1. A dynamic protection device, in particular for protecting integrated circuits having a MOS technology input stage against electrostatic discharges, comprising first and second reference potential lines; a connection line for connection to an integrated circuit to be protected; a first protection section including first switching means having a first input terminal and a first output terminal and defining a first unidirectional line for conducting current from said first input terminal to said first output terminal when the voltage drop from said first input terminal to said first output terminal of said first switching means exceeds a preset value defining a device upper threshold voltage value; a second protection section including second switching means having a second input terminal, a second output terminal and a further reference terminal and defining a second unidirectional line for conducting current from said second input terminal to said second output terminal when the voltage drop from said further reference terminal to said second output terminal exceeds a further preset value defining a device lower threshold voltage value, said first input terminal of said first switching means and said second output terminal of said second switching means being connected together and to said connection line, said first output terminal of said first switching means and said second input terminal of said second switching means being connected together and to said first reference potential line, and said further reference terminal being connected to said second reference potential line, thereby said first switching means turning on when the voltage drop from said connection line to said first reference potential line exceeds said device upper threshold voltage value and pulling a current from said connection line toward said first reference potential line and said second switching means turning on when the voltage drop from said second reference potential line to said connection line exceeds said device lower threshold voltage value and pulling a current from said first reference potential line toward said connection line.

2. A dynamic protection integrated device, in particular for integrated circuits having a MOS technology input stage, comprising first and second reference potential lines; a connection line for connection to an integrated circuit to be protected; first and second protection sections being arranged in parallel to each other between said first reference potential line and said connection line, and being further electrically connected to said second reference potential line, said first protection section including first switching means defining a preset device upper threshold voltage value; said second protection section including second switching means defining a preset device lower threshold voltage value, thereby said first switching means turning on when the voltage between said connection line and said first reference potential line exceeds said device upper threshold voltage value and pulling a current from said connection line toward said first reference potential line and said second switching means turning on when the voltage between said connection line and said second reference potential line falls below said device lower threshold voltage value and pulling a current from said first reference potential line toward said connection line, wherein said first section comprises a diode connected MOS transistor and said second section comprises a MOS inverter connected to a MOS transistor to form a voltage follower.

3. An integrated device according to claim 2, wherein said MOS inverter is made up of a pair of MOS transistors of the depletion type, with adjustable implantation level according to the desired value of said device lower threshold voltage value.

4. A dynamic protection integrated device, in particular for integrated circuits having a MOS technology input stage, comprising first and second reference potential lines; a connection line for connection to an integrated circuit to be protected; first and second protection sections being arranged in parallel to each other between said first reference potential line and said connection line, and being further electrically connected to said second reference potential line, said first protection section including first switching means defining a preset device upper threshold voltage value; said second protection section including second switching means defining a preset device lower threshold voltage value, thereby said first switching means turning on when the voltage between said connection line and said first reference potential line exceeds said device upper threshold voltage value and pulling a current from said connection line toward said first reference potential line and said second switching means turning on when the voltage between said connection line and said second reference potential line falls below said device lower threshold voltage value and pulling a current from said first reference potential line toward said connection line, wherein said first protection section comprises a first MOS transistor having own gate and drain terminals connected to each other and to said connection line and an own source terminal connected to said first reference potential line, and said second protection section comprises a second MOS transistor having an own drain terminal connected to said first reference potential line and own gate and source terminals connected to each other, a third MOS transistor having an own drain terminal connected to said gate and source terminals of said second MOS transistor, a gate terminal connected to said connection line and an own source terminal connected to said second reference potential line, and a fourth MOS transistor having an own drain terminal connected to said first reference potential line, an own source terminal connected to said connection line and an own gate terminal connected to said gate and source terminals of said second MOS transistor.

5. A device according to claim 4, wherein said first and fourth MOS transistors are of the enhancement type and said second and third MOS transistors are of the depletion type.

* * * * *